(12) United States Patent
Nakamura et al.

(10) Patent No.: US 6,565,648 B1
(45) Date of Patent: May 20, 2003

(54) PRODUCTION METHOD OF FERRO-ELECTRIC CRYSTALS HAVING PERIODICALLY-POLED STRUCTURE

(75) Inventors: Masaru Nakamura, Tsukuba (JP); Hirokazu Taniguchi, Itami (JP); Hirotaka Ito, Amagasaki (JP)

(73) Assignee: Mitsubishi Cable Industries, Ltd., Amagasaki (JP)

( * ) Notice: Subject to any disclaimer, the term of this patent is extended or adjusted under 35 U.S.C. 154(b) by 181 days.

(21) Appl. No.: 09/676,905

(22) Filed: Oct. 2, 2000

(51) Int. Cl.$^7$ .............................................. C30B 29/16
(52) U.S. Cl. ................. 117/2; 117/3; 117/948
(58) Field of Search ................. 117/2, 3, 948

(56) References Cited

U.S. PATENT DOCUMENTS

| | | | | |
|---|---|---|---|---|
| 5,519,802 A | * | 5/1996 | Field et al. ................. | 385/129 |
| 5,630,004 A | * | 5/1997 | Deacon et al. ................. | 385/9 |
| 5,912,910 A | * | 6/1999 | Sanders et al. ................. | 372/22 |
| 5,986,798 A | * | 11/1999 | Karlsson et al. ................. | 359/326 |
| 6,295,159 B1 | * | 9/2001 | Lung-Han et al. .......... | 359/326 |

OTHER PUBLICATIONS

Webjorn et al., "Quasi–phase–matched blue light generation in bulk lithium niobate, electrically poled via periodic liquid electrode", Electronics Letters vol. 30 No. 11 May 1994 pp. 894–895.*

* cited by examiner

Primary Examiner—Robert Kunemund
(74) Attorney, Agent, or Firm—Leydig, Voit & Mayer, Ltd.

(57) ABSTRACT

An electrolyte solution is used as a liquid electrode. The liquid electrode, as one electrode, is faced with a domain to be subjected to polarization inversion on one side surface of a substrate made of a ferro-electric crystal, and an electrolyte solution, as the other liquid electrode, is faced with the other surface of the substrate to allow an electric field to act at least on the domain to be subjected to polarization inversion. A polarization inverting voltage is applied onto the substrate via the both liquid electrodes at a temperature of 45° C. or above, thereby to invert the direction of polarization. By this method, a periodically-poled structure of an Mg doped $LiNbO_3$ crystal having a high quality can be formed.

7 Claims, 1 Drawing Sheet

PRODUCTION METHOD OF FERRO-ELECTRIC CRYSTALS HAVING PERIODICALLY-POLED STRUCTURE

FIELD OF THE INVENTION

The present invention relates to optical crystals. more particularly, the present invention relates to a periodically-poled structure of ferro-electric crystals.

BACKGROUND OF THE INVENTION

A periodically-poled structure, which is sometimes called a periodically domain-inverted structure or periodic polarization inverting structure, of ferro-electric crystals, includes periodical inversion of the direction of spontaneous polarization of a certain domain of a crystal. The periodical inversion includes not only repeats of inversion and non-inversion with a single period but also repeats of inversion and non-inversion with inconsistently varying periods to afford objective properties. When a ferro-electric crystal having a periodically-poled structure is used, a quasi-phase matching becomes possible and second harmonic generation and optical parametric oscillation are afforded.

A known method for forming a periodically-poled structure of a ferro-electric crystal is the application of an outside voltage using liquid electrodes. According to this method, an electrolyte solution is used as a liquid electrode, and an electric field is made to act on the crystal via the liquid electrodes, thereby to invert the direction of polarization of the concerned part.

The above-mentioned liquid electrodes are obtained by the use of a liquid metal. This method has a problem in that the removal of a residue of the liquid metal adhered to the surface of the crystal after a polarization inverting process takes a long time. In addition, a metal lead wire placed in contact with a liquid metal to establish an electric contact may be corroded, thus failing to allow a stable polarization inverting process.

Of the ferro-electric crystals, a specific ferro-electric crystal, such as Mg doped $LiNbO_3$ crystal (hereinafter to be also referred to as $Mg—LiNbO_3$ crystal) is drawing attention for its superior resistance to optical damage. However, this ferro-electric crystal easily suffers from disintegration of the crystal (crystal breakage) when forming a periodically-poled structure. Due to an easy leakage of the current through the breakage, therefore, a voltage cannot be applied, making the formation unfeasible.

Even if the problem of disintegration of crystals and the like can be overcome and polarization inversion can be performed, the domain where the direction of polarization has been inverted is still defective. This is because the state of inversion of the +z-plane and of the section from the +z-plane to the −z-plane is irregular and inconsistent, wherein the uniformity of the inversion varies from product to product and the same level of irregularity does not occur again.

It is therefore an object of the present invention to improve the production method of the periodically-poled structure of a ferro-electric crystal and to reduce the incidence of disintegration of the crystal when forming a periodically-poled structure, and further to improve uniformity of polarization inversion and reproducibility of the quality of the resulting products.

SUMMARY OF THE INVENTION

According to the present invention, there is now provided a production method of a ferro-electric crystal having a periodically-poled structure, which comprises the steps of:

(a) facing an electrolyte solution, as one liquid electrode, with a domain (region) to be subjected to polarization inversion, which is on one side surface of a substrate comprising a ferro-electric crystal, (b) facing an electrolyte solution, as the other liquid electrode, with the other surface of the substrate to allow an electric field to act at least on the domain, and (c) applying a polarization inverting voltage on the substrate via the both liquid electrodes at a temperature of 45° C. or above, thereby to invert the direction of polarization.

By setting the temperature to not less than 45° C. when applying a polarization inverting voltage via liquid electrodes, the voltage necessary for the inversion can be lowered. As a result, the disintegration of the crystal during the inverting process can be avoided even when an Mg doped $LiNbO_3$ crystal is used, and a desired polarization inverting structure can be formed.

According to the present invention, the temperature during the application of a polarization inverting voltage is more preferably not less than 100° C. In the present invention, an electrolyte solution having a boiling point higher than 100° C. is used to avoid boiling during processing.

DETAILED DESCRIPTION OF THE INVENTION

Figure 1:
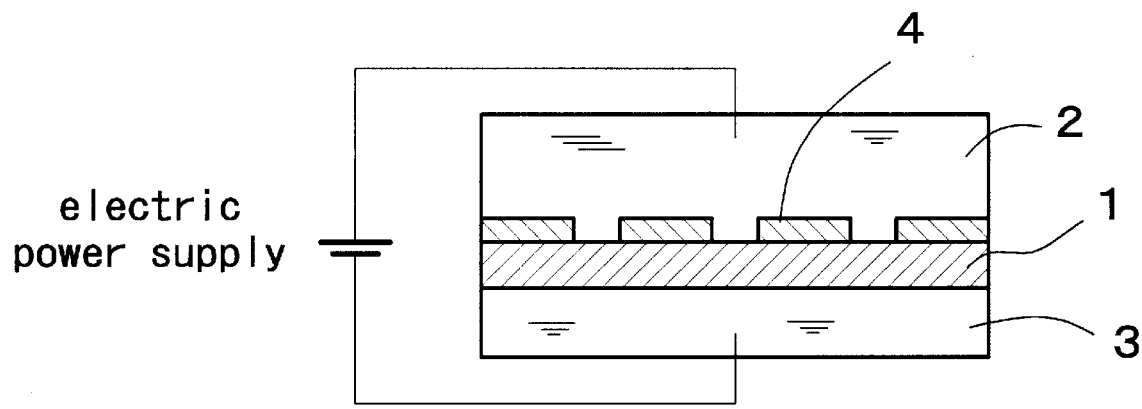
FIG. 1(a) and FIG. 1(b) schematically show one step of the production method of the present invention, wherein 1 is a substrate of ferro-electric crystal, 2 is a liquid electrode on the plus side, 3 is a liquid electrode on the minus side, 4 is an insulation film, and 5 is a polarization inverted portion.
Figure 1:
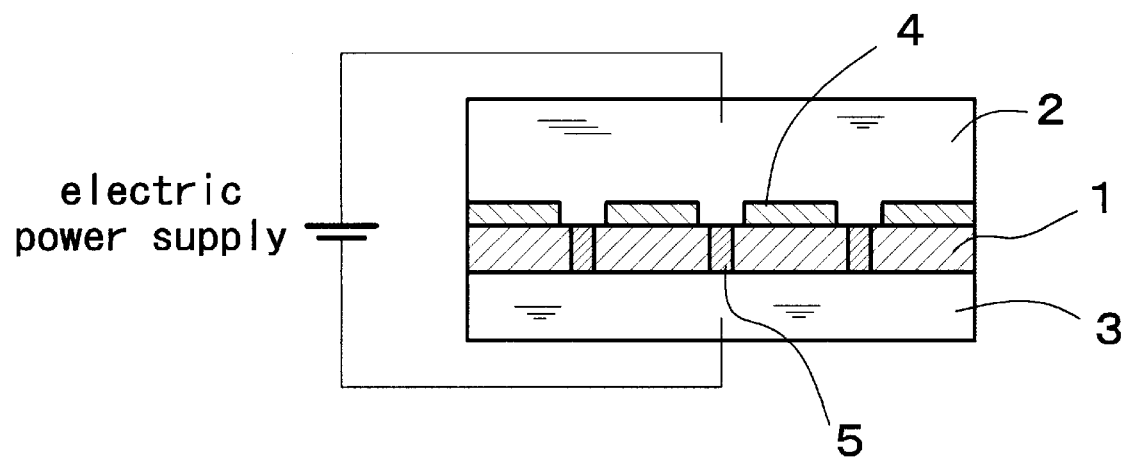

FIG. 1 shows a step for forming a periodically-poled structure of a ferro-electric crystal according to the production method of the present invention. In the embodiment of FIG. 1(a), the direction of polarization to be inverted is the direction of the z-axis, and a dielectric crystal substrate (i.e., z plate) 1 having two surfaces (+z-plane, −z-plane) perpendicular to the direction of the z-axis as the substrate surfaces is used.

The substrate is obtained by treating a dielectric crystal substrate for single polarization (single domain), as a result of which one side surface shows the same polarization in the entirety thereof.

In the above-mentioned dielectric crystal substrate 1, a liquid electrode 2 on the plus side (high voltage side) is faced with a domain on one side (+z-plane) of the substrate, which domain is to be subjected to polarization inversion. In the embodiment in FIG. 1(a), the electric field from the liquid electrode should act only on the specific domain on the +z-plane. Therefore, an insulation film 4 has been formed to mask the domain to be not faced.

In addition, a liquid electrode 3 on the minus side (ground side) is faced with the other surface (−z-plane) so that the electric field acts on the domain to be subjected to the polarization inversion. In this embodiment, the liquid electrode on the negative electrode side is in contact with the entirety of the −z-plane.

As used herein, by "faced" is meant a contact of a liquid electrode with a substrate surface, which is made directly or via a conductive film (e.g., metal thin film etc.).

As shown in FIG. 1(a), when the insulation film 4 is formed to face the liquid electrode 2, the insulation film 4 may be subject to damage upon application of a high temperature heat. Therefore, for example, a highly conductive metal thin film may be used to cover the entire side where the insulation film 4 has been formed. That is, the surface of the insulation film 4 and the exposed surface of the substrate may be covered with a metal thin film to protect the insulation film 4. In this case, the above-mentioned exposed surface is connected with the liquid electrode via the metal thin film.

By the application of a polarization inverting voltage to the substrate via the both liquid electrodes, while setting the temperature of the crystal, liquid electrodes and the like surrounding the substrate to not less than 45° C., polarization inversion while suppressing disintegration of the crystal becomes possible, whereby a ferro-electric crystal having a periodically-poled structure as shown in FIG. 1(b) is provided.

The ferro-electric crystal to be used for the production method of the present invention may be any as long as a polarization inverting structure can be formed. Particularly, a crystal showing various nonlinear optical effects, such as an electro-optic effect, is preferable.

For example, typical crystals such as $LiNbO_3$, $LiTaO_3$, $M_1TiOM_2O_4$ ($M_1$=K, Rb, Tl, Cs, $M_2$=P, As), and those doped with various elements are used. In particular, Mg—$LiNbO_3$ crystal is superior in resistance to optical damage but, as explained under the Prior Art, makes production unfeasible due to the disintegration of the crystal. When this crystal is used for the production, the advantage of the present invention becomes significant.

The temperature during voltage application is set to not less than 45° C. Because the polarization inverting voltage (voltage of threshold when polarization inversion begins) becomes lower with increasing temperatures, higher temperature is more preferable. Particularly, a temperature of not less than 100° C. is preferable to sufficiently suppress the incidence of disintegration of the crystal. Therefore, a temperature range that produces no changes in the crystal, liquid electrodes and other accessories is preferable.

An electrolyte solution to be used for the liquid electrode should not boil at a temperature of not less than 45° C., particularly preferably not less than 100° C., which is the temperature employed during application of the voltage.

Therefore, the electrolyte solution preferably has a boiling point higher than the above-mentioned temperature under atmospheric pressure. It is also possible to make the pressure of the atmosphere higher in order to elevate the boiling point. In this case, a material free of decomposition under such high pressure and high temperature conditions is used.

When the temperature during application of the voltage is not less than 100° C. under atmospheric pressure, an electrolyte solution containing an electrolyte material and a solvent having a boiling point higher than 100° C. is preferably used at a temperature, at which the electrolyte solution does not boil. Examples of the solvent include polyol, a mixture of polyol and water and the like, that have a boiling point elevated to more than 100° C. by the addition of polyol. Of the polyols, alkylene glycol, particularly, ethylene glycol having a boiling point of 197.6° C., is preferably used as a solvent for lithium chloride and the like.

The electrolyte material is any that is used for conventional liquid electrode method. In particular, lithium chloride is a preferable electrolyte material because it dissolves well in ethylene glycol and polyethylene glycol.

When the polarization inverting voltage is applied, the voltage may be increased stepwise. Alternatively, a voltage elevating stage at a rate of approximately 1–10 V/sec may be formed in the initial stage of voltage application, to moderately increase the voltage to be applied.

The temperature during voltage application is set to 45° C. or above by allowing the both liquid electrodes to face the crystal substrate, placing the whole in an insulating liquid and heating the insulating liquid, whereby the temperature of the entirety, including both the liquid electrodes and crystal substrate, is increased. According to this method, an unintentional discharge (creeping discharge) on the crystal (substrate) surface can be prevented. This is useful when a high voltage is needed for polarization inversion of a thick crystal. Such insulating liquid is exemplified by an insulating oil such as silicone oil, inert insulating liquid (e.g., fluorinert), insulating gas (e.g., SF6), and the like.

The present invention is explained in detail by referring to an illustrative example. The present invention is not limited by this example in any way.

EXAMPLE 1

In this Example, an Mg—$LiNbO_3$ crystal having a periodically-poled structure was actually produced.

As schematically shown in FIG. 1, a 0.5 mm thick, +z-cut Mg—$LiNbO_3$ crystal substrate after single polarization was used as a crystal substrate 1. The +z-plane and the −z-plane of the substrate 1 had been optically ground.

A resist film 4 having a periodically banded mask pattern (grating pattern) was formed by photolithography on the +z-plane of this substrate as an insulation film. The banded mask pattern includes a band-like masked part and a band-like exposed part alternately disposed to form a stripe pattern. The width of the band-like masked part was 17 μm and that of the band-like exposed part was 12 μm. Au was applied thereon in the thickness of 4000 Å by sputtering.

As shown in FIG. 1, the +z-plane of the substrate 1 was brought into contact with the liquid electrode 2 on the plus side, and the −z-plane was brought into contact with the liquid electrode 3 on the minus side. As the liquid electrode, an electrolyte solution obtained by dissolving lithium chloride in ethylene glycol as a solvent was used. This was placed in a container for the liquid electrode and set on the substrate surface to allow contact of the liquid electrode with the substrate surface. The obtained product was placed in a silicone oil bath and the temperature of the entirety including the crystal was raised to about 100° C. to start voltage application.

The polarization inverting voltage was raised from 0 V to 1.5 kV at a rate of 1 V/sec. The voltage of 1.5 kV was maintained for 10 seconds to allow polarization inversion, whereby Mg—$LiNbO_3$ crystal having a periodically-poled structure was obtained.

[Evaluation]

The obtained Mg—$LiNbO_3$ crystal was observed for the periodically-poled structure. As a result, a periodically-poled structure having a highly precise banded pattern was confirmed in the entire region in the z-plane where grating had been formed. The polarization inverted band-like portion in the +z-plane was observed but no irregularities or inconsistency was found. The y plane of the substrate was cut to see the state of polarization inversion of the section from the +z-plane to the −z-plane. As a result, the state of polarization inversion was constant. This periodically-poled structure was examined in detail. The ratio of inversion was 50:50.

According to the present invention, disintegration of the crystal, that occurs when forming a periodically-poled structure of a ferro-electric crystal, particularly Mg—$LiNbO_3$ crystal, can be prevented. When compared to the conventional method using a liquid metal, a surface washing process after polarization inversion has become feasible, which in turn dramatically increases the productivity. In addition, corrosion of an electrical contact with a liquid electrode has decreased and the polarization inversion process has become stable.

What is claimed is:

1. A production method of a ferro-electric crystal having a periodically-poled structure, which comprises the steps of:

(a) facing an electrolyte solution, as one liquid electrode, with a domain to be subjected to polarization inversion, which is on one side surface of a substrate comprising a ferro-electric crystal, (b) facing an electrolyte solution, as the other liquid electrode, with the other surface of the substrate to allow an electric field to act at least on said domain, and (c) applying a polarization inverting voltage on the substrate via the both liquid electrodes at a temperature of 45° C. or above, thereby to invert the direction of polarization.

2. The production method of claim 1, wherein the step (a) comprises forming an insulation film on one surface of the substrate except said domain, and facing the liquid electrode with the exposed surface.

3. The production method of claim 2, further comprising covering the surface of the substrate having the insulation film with a metal film such that the liquid electrode is brought into contact with the exposed surface via the metal film.

4. The production method of claim 1, wherein the electrolyte solution comprises an electrolyte material and a solvent having a boiling point higher than 100° C., and the polarization inverting voltage is applied at a temperature, which is not less than 100° C. and at which the electrolyte solution does not boil.

5. The production method of claim 4, wherein the solvent comprises at least polyol and the electrolyte material is lithium chloride.

6. The production method of claim 1, wherein the ferro-electric crystal is an Mg doped $LiNbO_3$ crystal.

7. The production method of claim 1, wherein the ferro-electric crystal is heated to 45° C. or above by placing the ferro-electric crystal in an insulating liquid and heating the insulating liquid.

* * * * *